United States Patent
Hieter et al.

(10) Patent No.: US 7,178,120 B2
(45) Date of Patent: Feb. 13, 2007

(54) METHOD FOR PERFORMING TIMING CLOSURE ON VLSI CHIPS IN A DISTRIBUTED ENVIRONMENT

(75) Inventors: Nathaniel Hieter, Clinton Corners, NY (US); David J. Hathaway, Underhill Center, VT (US); Prabhakar Kudva, New York, NY (US); David S. Kung, Chappaqua, NY (US); Leon Stok, Croton on Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 405 days.

(21) Appl. No.: 10/338,929

(22) Filed: Jan. 8, 2003

(65) Prior Publication Data

US 2004/0133860 A1    Jul. 8, 2004

(51) Int. Cl.
*G06H 17/50*    (2006.01)
*G06H 9/45*    (2006.01)

(52) U.S. Cl. ............................................. 716/6; 716/7
(58) Field of Classification Search .................... 716/2, 716/6, 7
See application file for complete search history.

(56) References Cited

U.S. PATENT DOCUMENTS

| | | | |
|---|---|---|---|
| 5,218,551 A | * | 6/1993 | Agrawal et al. .............. 716/10 |
| 5,602,754 A | | 2/1997 | Beatty et al. |
| 5,877,965 A | | 3/1999 | Hieter et al. |
| 6,202,192 B1 | | 3/2001 | Donath et al. |

* cited by examiner

*Primary Examiner*—Leigh M. Garbowski
(74) *Attorney, Agent, or Firm*—H. Daniel Schnurmann

(57) ABSTRACT

A method for performing timing closure on VLSI chips in a distributed environment is described. Abstracting the physical and timing resources of a chip and providing an asynchronous method of updating that abstraction allows multiple partitions of a chip to be optimized concurrently. A global view of physical and timing resources is supplied to local optimizations which are applied concurrently to achieve timing closure. Portions of the hierarchy are optimized in separate processes. Partitioning of the chip is performed along hierarchical lines, with each process owning a single partition in the hierarchy. The processes may be executed by a single computer, or spread across multiple computers in a local network. While optimizations performed by a single process are only applied to its given portion of the hierarchy, decisions are made in the context of the entire hierarchy. These optimizations include placement, synthesis, and routing. The present method can also be expanded to include other resources, such as routing resource, power supply current, power/thermal budget, substrate noise budget, and the like, all of which being able to be similarly abstracted and shared.

17 Claims, 7 Drawing Sheets

Figure 1

(Prior Art)

Figure 2

(Prior Art)

Figure 3

Figure 4 - Server

Figure 5 - Client

METHOD FOR PERFORMING TIMING CLOSURE ON VLSI CHIPS IN A DISTRIBUTED ENVIRONMENT

FIELD OF THE INVENTION

This invention is related to conducting a distributed optimization of a partitioned data model by reallocation of physical and timing resources, and more particularly, to a method for achieving timing closure on VLSI chips in a distributed environment.

BACKGROUND OF THE INVENTION

The problem of timing closure of Very Large Scale Integrated (VLSI) chips or integrated circuits involves the combination of logic synthesis algorithms with placement and routing algorithms in order to meet timing, area, and other design objectives for the chip. Logic synthesis algorithms change the type and connectivity of circuits used to implement the functionality of the chip. Placement algorithms alter the physical locations of the circuits on the chip. Routing algorithms modify the wire type and path of the connections between the circuits. As the size of the VLSI chips grows, the problem of timing closure increases correspondingly at a geometric rate. A hierarchical chip optimization process limits the run time required to achieve timing closure. Partitioning the problem along hierarchical boundaries reduces the individual problem size, while allowing smaller problems to be solved in parallel.

This optimization process operates in a distributed manner by taking advantage of data parallelism. Since timing closure is a global problem, it provides unique difficulties when attempting partitioning. One of the goals of timing closure is to ensure that the chip operates at the desired frequency. The frequency of a chip is limited by the transmission delay through the longest path of circuits on the chip. Partitioning the problem along hierarchical boundaries usually produces circuit paths that traverse multiple partitions. Such a path presents, by definition, a global challenge. Similarly, each circuit in the entire chip hierarchy may be placed at any point on the chip image. While the problem of size may be reduced by partitioning along hierarchical boundaries, physical and timing resources must still be managed for the entire chip.

The chip is usually partitioned using logical hierarchy or physical hierarchy. The logical hierarchy is typically expressed in the original Hardware Description Language (HDL) used to describe the functionality of the chip. The physical hierarchy is created by flattening the chip and performing an initial placement of the integrated circuits. From this placement, the chip is carved up in such a way that the partitions are regular interlocking shapes on the chip image. Each method has certain advantages and disadvantages. Retaining the logical hierarchy makes it easier for the chip designer to understand the current state of the chip. It also allows the designer to make changes in the original HDL and only re-optimize the partition in the hierarchy that contains the change. While using a physical-centric partitioning strategy requires a complete re-optimization of the entire chip in the event of an HDL change, it does present appreciable benefits. For example, partitioning along the original logic hierarchy (also called floor planning) may limit the quality of the placement optimization algorithms.

Figure 1:
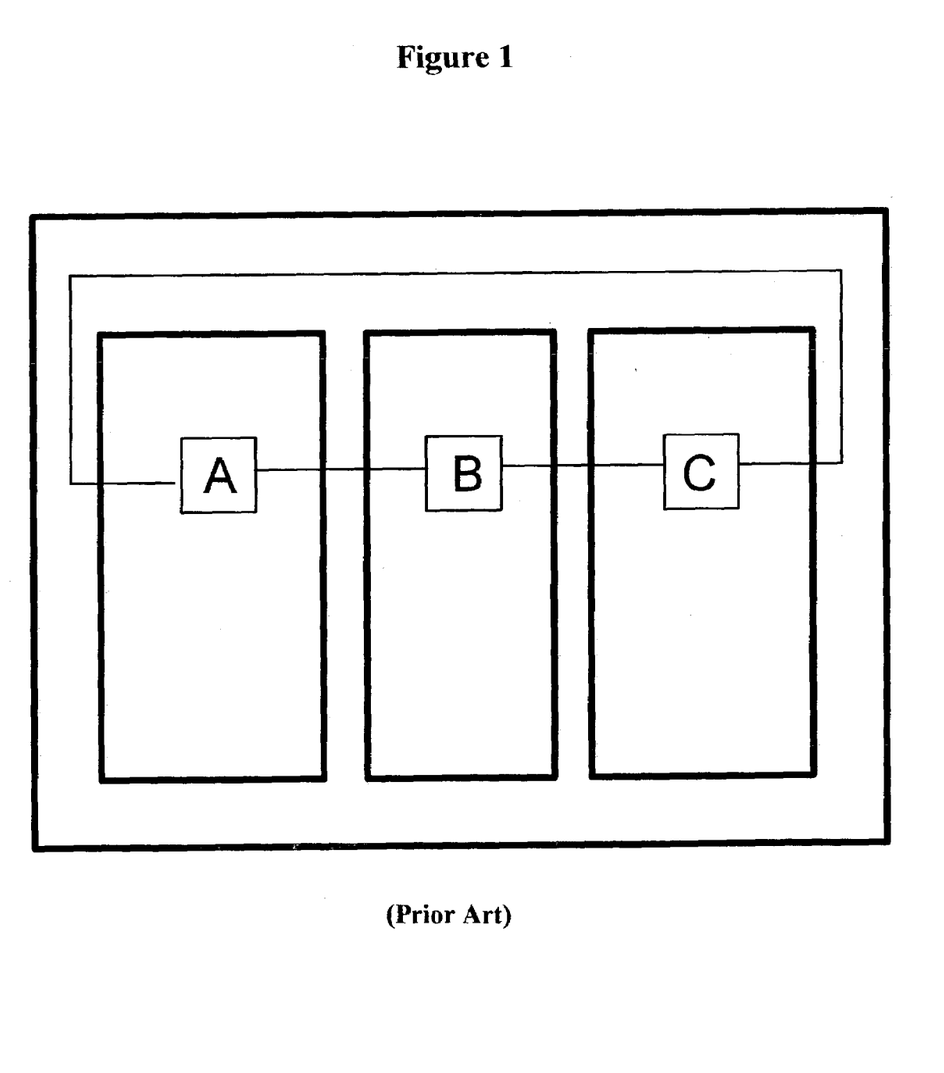
FIG. 1 is a block diagram showing a circuit path traversing several hierarchical boundaries using a conventional floor planner.

FIG. 1 describes a circuit path that traverses several hierarchical boundaries. The floor planning shown presents a long path from A to C regardless of where the circuits are placed within their respective partitions. Once the chip is partitioned into a given hierarchy, boundaries are referred to being either soft or hard depending upon the management of the physical and timing resources. Hard hierarchical boundaries imply that once the resources are distributed among the partitions they remain unchanged throughout the optimization procedure. Soft hierarchical boundaries start with an initial distribution and allow the distribution to be updated to facilitate timing closure. The main benefit of hard hierarchical boundaries is that the entire closure problem is broken down into completely encapsulated sub-problems. This reduces the complexity of the sub-problems since the physical and timing constraints remain constant, obviating the need for any communication among the partitions. This distribution of resources is in the form of a disjoint set. For example, circuits of separately optimized partitions occupy disjoint physical regions of the chip. However, an optimal initial distribution of resources into disjoint sets along partition boundaries cannot be exactly determined up front. Employing soft hierarchical boundaries allows the optimization procedure to redistribute physical and timing resources as necessary given changes to the state of the design. Allowing flexibility in the allocation of resources improves the quality of the design.

U.S. Pat. No. 5,877,965 to Hieter et al. "Parallel hierarchical timing correction" (PHTC) describes a distributed method of timing closure wherein each execution process operating in parallel receives a copy of all the partitions in the chip hierarchy. The problem of timing closure is distributed by virtue of the fact that each of the parallel processes optimizes a different partition in the hierarchy. Therefore, even though each parallel process receives the entire hierarchy containing all partitions, no two processes work on the same partition. While each process begins with a replica of the initial state of the entire chip hierarchy, over time, the partitions for which the process is not responsible (those that are read-only) become stale. Each process only operates on one partition, leaving the remaining partitions in the hierarchy unchanged. Since timing closure is a global problem, decisions made in one partition of the hierarchy usually affects other partitions. Therefore, the initial state of the entire hierarchy that was given to each process at its inception may no longer be trustworthy as the work of timing closure is pursued. To overcome this difficulty, an individual process will periodically export a copy of the partition in the hierarchy for which it has write-access to a database. After export, the process searches the database for updated partitions from other parallel processes. If the process finds a partition in the database that is more recent than the one in the current replica of the chip hierarchy, then it will import this partition into its replica. If the periodicity of exporting and importing is frequent enough, then each process has a reasonably accurate view of the current state of the entire chip hierarchy. Thus, this method allows each parallel process to have a global view of the timing graph for the entire chip hierarchy which is necessary for timing closure.

However, the aforementioned prior art suffers from significant drawbacks. While prior art methodology distributes the workload along hierarchical boundaries to parallel processes, each process must be executed on computing resource sufficiently powerful to load the entire chip hierarchy despite the fact that only one portion of the hierarchy is being modified. As the size of VLSI chips continues to grow, this method will be limited to very expensive powerful servers. Clearly, it would be preferable to load only one partition and abstract the impact of the remainder of the hierarchy in some fashion.

Additionally, prior art methods for transmitting optimization changes to a partition is very coarse. Regardless of the extent of the changes to a particular partition, the process will periodically write out the entire partition. Since partitions are only exported to express the updated timing graph, it would be more efficient to only communicate the changes to the timing graph at the boundaries of the partition.

Finally, the prior art does not teach the use of shared physical resources. For the purposes of physical resources, the prior art employs a hard hierarchical boundary paradigm. While PHTC may include algorithms that modify placement data, each partition is limited to the physical resources it was initially given.

U.S. Pat. No. 6,202,192 to Donath et al. "Distributed Static Timing Analysis" and U.S. Pat. No. 5,602,754 to Beatty et al "Parallel execution of a complex task partitioned into a plurality of entities" describe methods to distribute the procedure of static timing analysis on a hierarchical chip. Each partition in the hierarchy is analyzed in a separate process. In order to build a complete timing graph of the entire hierarchy, the processes communicate timing information to each other regarding signals that cross hierarchical boundaries.

Figure 2:
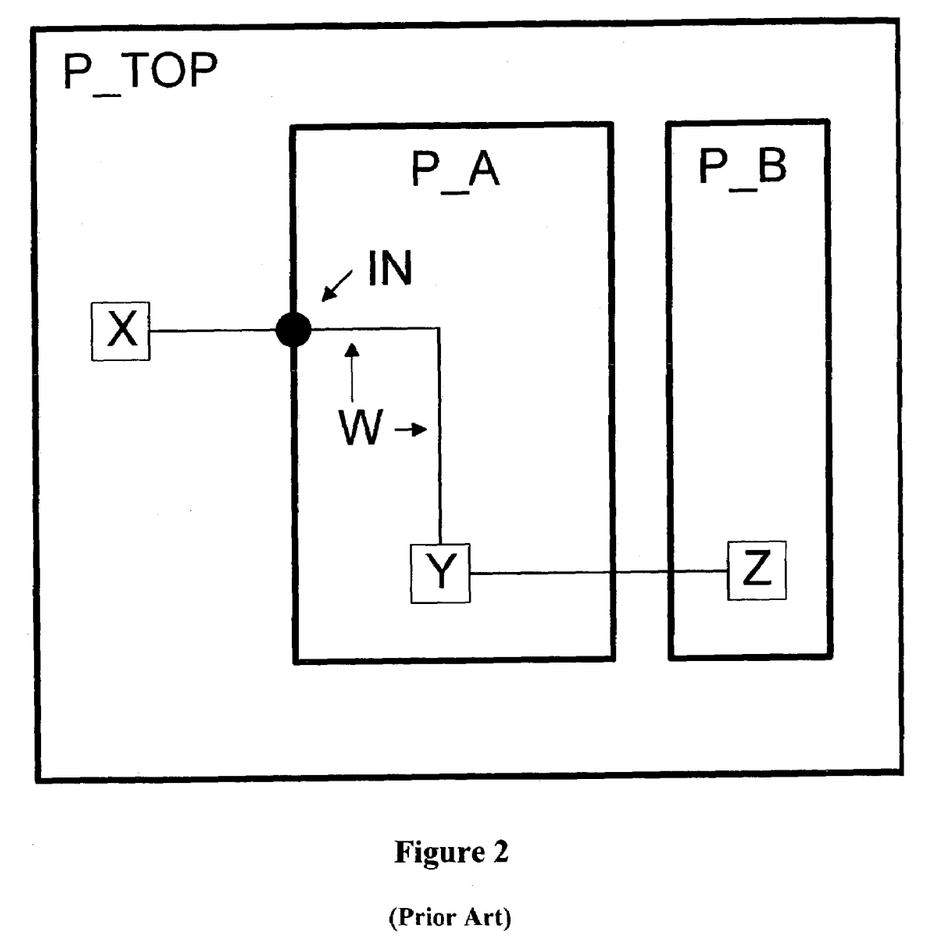
FIG. 2 is a block diagram representation of a conventional hierarchical circuit path through a plurality of partitions.

For example, referring to FIG. 2, there is shown three partitions P_TOP, P_A, P_B, each analyzed in a separate process. Partitions P_TOP and P_A intersect at a point on the hierarchical boundary, A_IN. At this point, P_TOP communicates information, such as signal arrival time to P_A. In a similar fashion, P_A communicates information, such as the capacitive load of wire W to P_TOP.

With regard to timing resources, the prior art describes a method of maintaining soft hierarchical boundaries. However, it does not cover the management of physical resources during distributed optimization. While the prior art is an essential component in the system that performs timing closure on a hierarchical design, since it does not teach the reallocation of physical resources, it requires that the physical resources remain static throughout optimization. This severely limits the optimality of the final result.

OBJECTS OF THE INVENTION

Accordingly, it is an object of the invention to provide a method for performing timing closure on large VLSI chips, where in order to find a solution in a reasonable amount of time, the problem is distributed along hierarchical boundaries and processed in parallel.

It is another object of the invention to partition a VLSI chip using a logical hierarchy, providing incremental changes to the original HDL.

It is still another object to provide a method that employs soft hierarchical boundaries for both physical and timing resources in order to improve the quality of the final result, (e.g., the timing information at the hierarchical boundaries remains in flux throughout the optimization process and the physical locations of circuits in a given partition are not constrained to stay within a specified region, allowing for physical representations of various partitions to overlap with one another, freely spanning across the entire chip).

It is yet a further object to provide a method for maintaining the allocation of resources across partitions, and which does not require each parallel process partition to include an entire copy of the resource map.

SUMMARY OF THE INVENTION

In one aspect of the invention, there is described a method that provides a global view of physical and timing resources to local optimizations applied in parallel in order to achieve timing closure. This global view of the distribution of physical and timing resources is referred to as the resource map. Multiple portions of the hierarchy are optimized concurrently, each in a separate process. The problem is partitioned along hierarchical lines, each process owning a single partition within the hierarchy. The processes may be executed by a single computer, or spread across multiple computers in a local network. While the optimizations performed by a single process are only applied to its given portion of the hierarchy, they make decisions in the context of the entire hierarchy. These optimizations include algorithms such as placement, synthesis, and routing.

For a process that views only a portion of the hierarchy, two conditions must be fulfilled to allow the process to operate within the context of the entire hierarchy. First, based upon the initial state of the chip, the physical and timing resources of the entire chip must be distributed among the various partitions. By way of example, a process is given a portion of the physical real estate on the chip image in which to place its partition. Second, the initial timing characteristics of the signals traveling in and out of a partition through the hierarchical boundaries are determined and distributed to each process. These physical and timing resources are apportioned such that if each partition achieves timing closure, then the entire chip achieves timing closure. However, as each process optimizes its individual partition, the state of the chip changes and the initial distribution of resources may no longer be desirable. Therefore, throughout the optimization, the various processes must communicate amongst themselves regarding the consumption and release of physical and timing resources.

BRIEF DESCRIPTION OF THE DRAWINGS

The accompanying drawings which are incorporated and which form part of the specification illustrate presently a preferred embodiment of the invention and, together with the general description given above and the detailed description of the preferred embodiment given below, serve to explain the principles of the invention.

FIGS. 6 and 7 are block diagrams representing the physical resource abstraction, wherein FIG. 6 shows a representation of circuits being placed arbitrarily in the chip, and FIG. 7 shows a physical placement of circuits being abstracted into the bin structure, in accordance with the present invention.

DETAILED DESCRIPTION OF THE INVENTION

Figure 3:
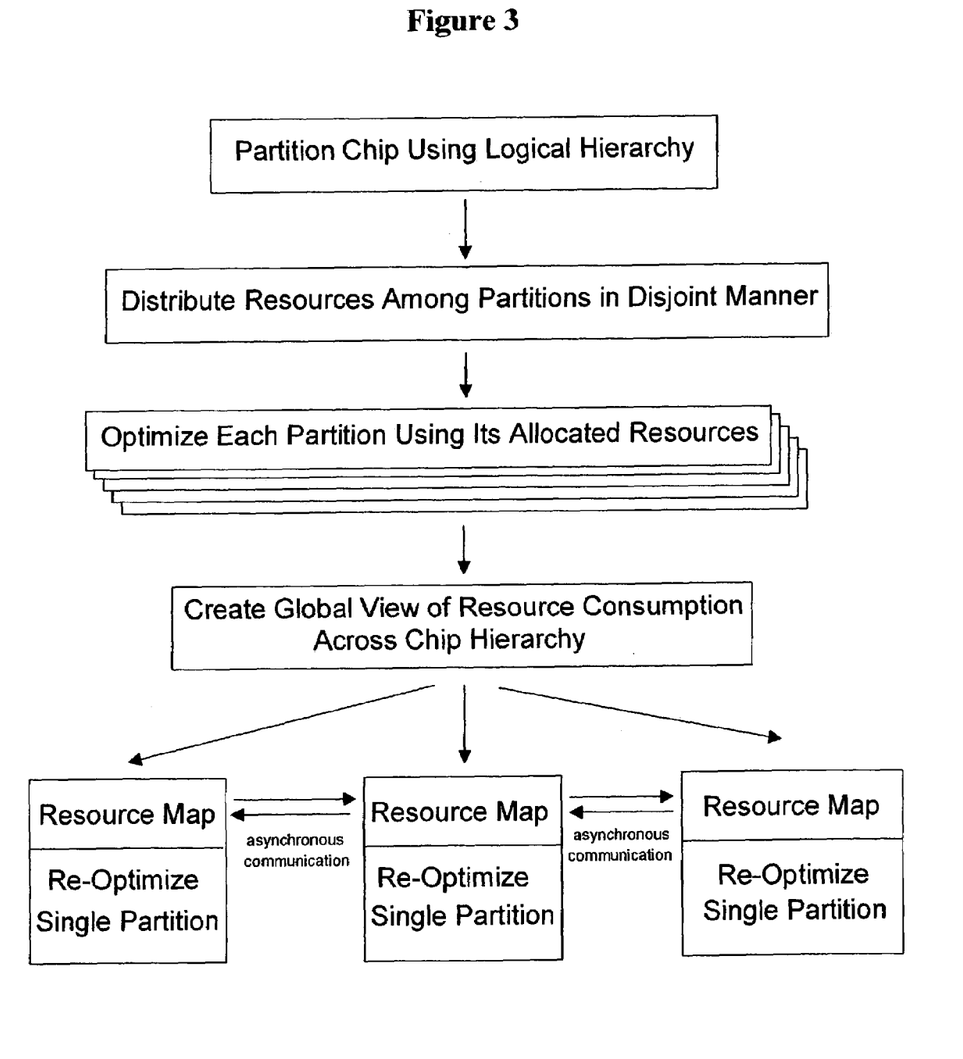
FIG. 3 is a flow chart describing the process for achieving time closure, according to the present invention.

The inventive method described hereinafter follows the sequence of basic steps illustrated in FIG. 3.

1. The process begins with a hierarchical design. A small number of partitions implies that the size of the average partition is large and, thus, will impact the run time. As the number of partitions increases, the sub-problem size may decrease, although the communication complexity will increase.
2. An initial distribution of physical and timing resources is performed. This initial distribution is in the form of hard hierarchical boundaries designed to bring about a near optimal result. The resources are allocated in a disjoint manner that allows each partition to be optimized independently from each other.
3. Each partition is processed in parallel using the initial fixed resource allocation. The purpose of this step is to bring the chip as close to the final result as possible. However, the inflexible hierarchical boundaries may have prevented timing closure. The term 'processed in parallel' denotes any set of asynchronous execution streams which optimize portions of the design in parallel, whether by having messages passing between non-shared memory computers or by using different processors within a shared memory multiprocessor.
4. The partitions are now brought back together in one process such that the complete hierarchy is visible. From this hierarchy, abstractions of the global utilization of physical and timing resources may be generated. By way of example, such a physical resource utilization abstraction might be a partitioning of the chip area into small bins and an indication of the percentage of the area of each bin required to place all the circuits currently assigned to the bin. This reduces the physical description of the chip from having an actual location for each circuit to simply a series of bins and the available space therein. Similarly, the timing resources may also be abstracted. Instead of providing a complete timing graph of the entire hierarchy to each partition, a database of hierarchical boundary points is maintained. For each boundary point, information such as signal arrival time and capacitive load is stored. This represents a dramatic reduction in the amount of data required to be maintained by each partition.
5. Each partition is once again processed in parallel. Each partition begins with an initial abstraction of the previously calculated resource maps. Each partition is processed in an iterative loop wherein optimization takes place followed by communication regarding any changes to the local resource abstractions. This communication is necessary to track the consumption and release of physical and timing resources. In this manner, the work of optimization is relegated to discovering the final optimal distribution of resources. It is possible that this distribution is far different from the initial approximation performed in step 2.

Steps 4 and 5 are essential aspects of the invention as they enable timing closure of designs where it is not possible to optimally allocate physical and timing resources before individual partition optimization. The redistribution of physical resources during the re-optimization phase obviates the need to constrain the physical location of a particular partition to a sub-region of the chip image. This implies that the partitioning of the chip may follow the logical hierarchy without impacting the quality of the final results.

The inventive method presents a framework for redistribution of resources and re-optimization of hierarchical partitions when the sub-optimality of the initial apportionment prevents timing closure.

The preferred embodiment of the present invention will now be described, for illustrative purposes, in the context of client-server architecture, although the invention is broader in scope. A client-server architecture is a paradigm wherein one server and multiple clients are each executed in a separate process. The server maintains a database that is shared among the clients. The information in this database is accessed through a message passing facility. Communication is limited to server-client conversation. In this architecture, there is no peer-to-peer communication between clients, although it will be obvious to one skilled in the art that the inventive method could be practiced using such peer-to-peer communication.

For illustrative purposes, each client represents a single partition in the chip hierarchy, with each client responsible for re-optimizing a given partition. The server is not associated with any specific partition. Instead, it owns the global view of the physical and timing resources (the resource map) for the entire chip. This resource map describes the initial apportionment and abstraction of resources across the chip hierarchy. Each client is given an initial resource map relevant to the partition for which it is responsible.

In the case of physical resources, data will be abstracted using a bin structure, i.e., by having the chip image subdivided into bins. Available physical resources and constraints are maintained and are associated with each bin, for instance, the availability of 'legal' placement area, voltage island capacity, availability of wire routing resources in and through the bin. In the case of timing resources, the signal characteristics at hierarchical boundary crossings are maintained. These characteristics include the actual arrival time of the signal, its desired arrival time, its rising and falling transition times, the capacitive load, the capacitive limit, and the like There are two basic types of messages transmitted between the client and the server. The first is a notification request that the client sends to the server. Although the server maintains a complete view of all physical and timing resources, the client may not be concerned with the entire resource map. For instance, where physical resources are concerned, a client may only be interested in a subset of the bins, e.g., those which are withing some specified distance of the region to which the partition was initially restricted. Furthermore, the client is only interested in the timing characteristics of the hierarchical boundaries it contacts. Therefore, each client must declare to the server those portions of the resource map for which there is interest. The second type of message is a resource update. A client will inform the server when it makes a change to a particular point (bin, hierarchical boundary, and the like) on the resource map. In turn, the server informs at that point all other clients which previously asserted notification requests.

As the various clients optimize their respective assigned partition, they communicate changes in the physical and timing resources to the server. These optimizations may include assigning a circuit to a particular bin or modifying a circuit such that the transmission delay through the circuit changes, impacting the arrival time at the hierarchical boundary. In case of a physical change to the bin, once the server receives the update it may broadcast this change to the remaining clients because many clients may have an interest in the changed bin, or it may communicate it to only those partitions which have previously requested notification of changes to that bin. In the case of a timing change at a hierarchical boundary, only the client on the other side of the boundary needs to be notified.

Since the optimization processes are performed simultaneously upon a plurality of partitions in the hierarchy, and since the resource update mechanism is asynchronous in nature, it is possible to over-consume a particular resource. This problem can be alleviated by way of frequent updates, but care must be taken to ensure that client-server communication does not dominate the run time.

Client Server Architecture Optimization Process

Figure 4:
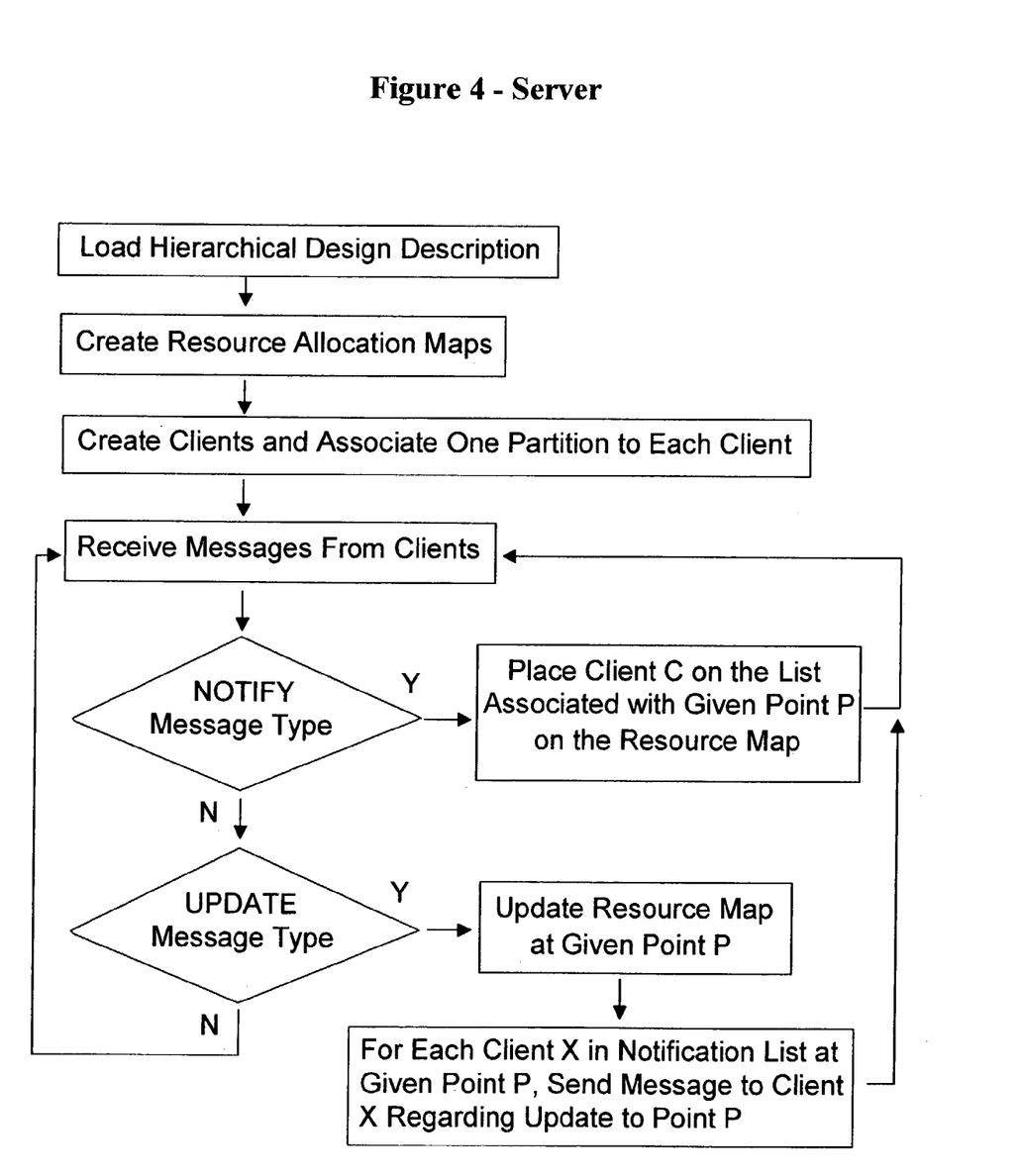
FIG. 4 is a flow chart representing the preferred embodiment of the present invention, wherein the server side of a server-client architecture is shown.
Figure 5:
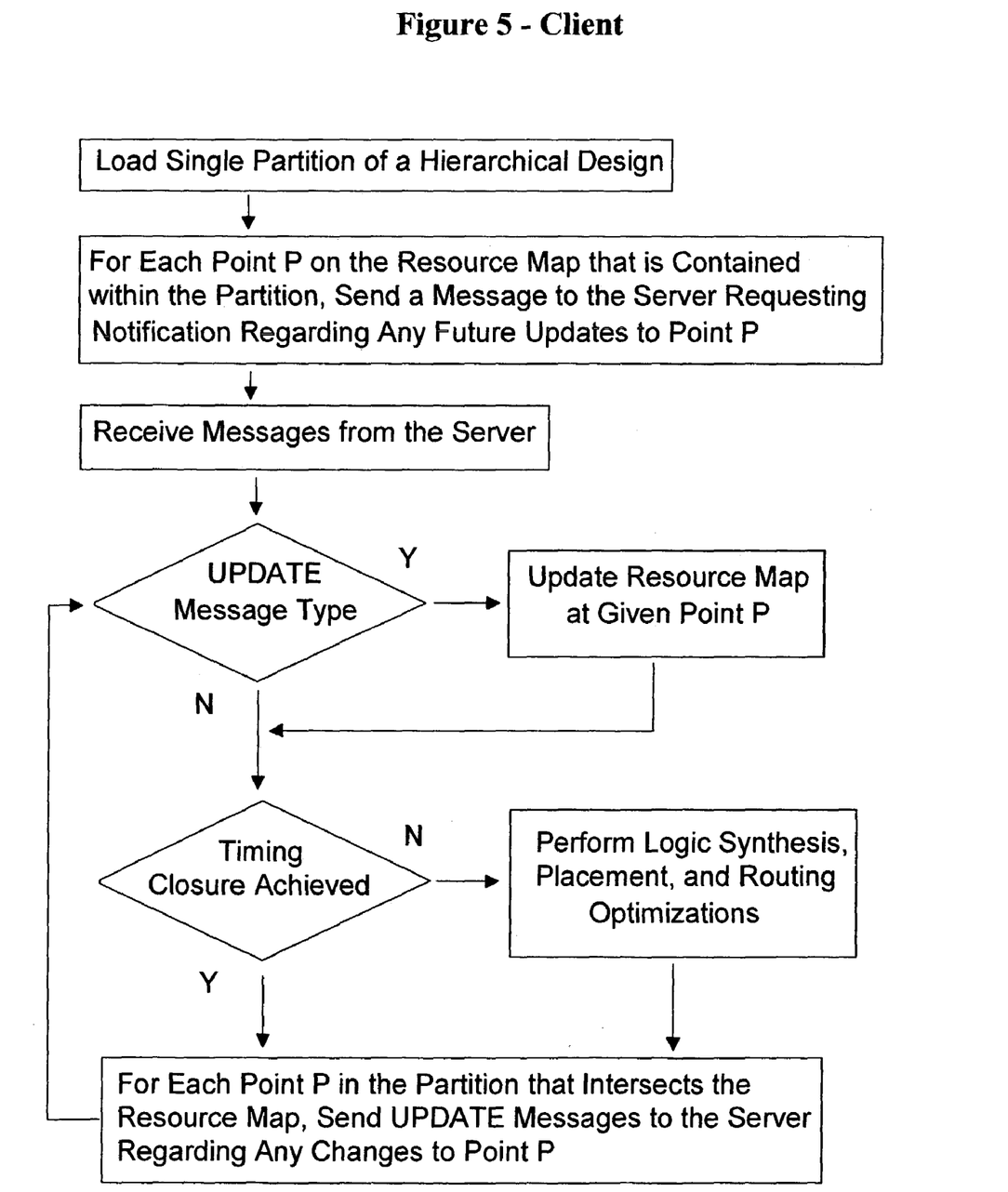
FIG. 5 is a flow chart representing the preferred embodiment of the present invention, wherein the client side of the server-client architecture is shown.

The re-optimization process is described in pseudo-code hereinafter, and in conjunction with FIGS. 4 and 5. There will be only one server process per chip hierarchy and one client process for each partition in the hierarchy.

Server:

```
Load hierarchical design description
Create resource allocation maps
Create clients and associate one partition to seach client
While( Message received from client )
{
  If( Message Type == NOTIFY )
  {
    Place client C on list associated with given point P on resource map
  }
  If( Message Type == UPDATE )
  {
    Update resource map at given point P
    For each client X in notification list at given point P on resource map
    {
      Send message to client X regarding UPDATE at point P
    }
  }
}
```

Client:

```
Load partition of hierarchical design
For each point P of interest on resource map
{
  Track current value of resource at point P
  Send message to server requesting NOTIFICATION
  regarding changes to point P
}
While( Message received from server OR Timing closure not achieved)
{
  If( Message Received AND Message Type == UPDATE )
  {
    Update resource map at given point P
  }
  If( Timing closure not achieved )
  {
    Perform logic synthesis, placement, routing optimizations
  }
  For each point P of interest on resource map
  {
    If ( Current value of resource at point P different from tracked value )
    {
      Send message to server regarding UPDATE at point P
    }
  }
}
```

Physical Abstraction

Bin data structures have been widely used within the context of placement algorithms and form the basis for the physical abstraction used in the present invention. This involves carving up the chip image into a plurality of non-overlapping bins. Instead of providing an exact location to each circuit in the entire chip, the circuits are assigned to a particular bin with their location floating inside the bin. Usually placement algorithms run on a single processor wherein all the chip data resides. Therefore, it is relatively straightforward for the placement process to appropriately update the bin information as it makes progress through the placement. In the case of a distributed environment (as described in the last section), the problem becomes significantly more complex since the placement data is shared by a plurality of processes that include the server and the many clients.

Given a hierarchical chip, the server first creates a master copy of a bin based data structure. The following information is associated with each bin:

1. the total placement resources available within the bin for placeable objects, the placeable objects themselves with certain constraints (e.g., circuits operating at different voltages), routing resources, buffer bays, and the like. The total available resource is referred to 'capacity of the bin' and for a circuit area resource might be defined as the total area of the bin minus the area occupied by pre-placed circuits or other blockages. The capacity of a bin may be subdivided for specific purposes (e.g., reserving 10% of the bin for buffers, or specifying a specific division of the bin into areas for low and high voltage circuits), or a single resource capacity may be used to allow tradeoffs between different usages, and 2. the amount of each type of resource used by each partition within the bin. The sum of these usages for a given resource type in a given bin is referred to the occupancy of that resource within the bin.

Update Mechanism for Physical Abstraction

1. Once clients are initiated, each client is given a copy of the physical abstraction, which it updates as part of its local timing closure. The client only updates its local copy.

2. At a suitable point, each client sends a message to the server regarding changes to its local copy. Such a suitable point may occur every time when the client introduces a change, when the occupancy of some bin changes by a certain percentage, or at fixed time intervals.

3. The server updates its own copy of the physical abstraction based on the messages from the clients. At an appropriate point, it transmits messages to the clients regarding the status of the master copy. The appropriate points for sending updates to clients occur when a change is received from a client, when some bin occupancy changes by a given percentage, or at fixed time intervals.

Figure 6:
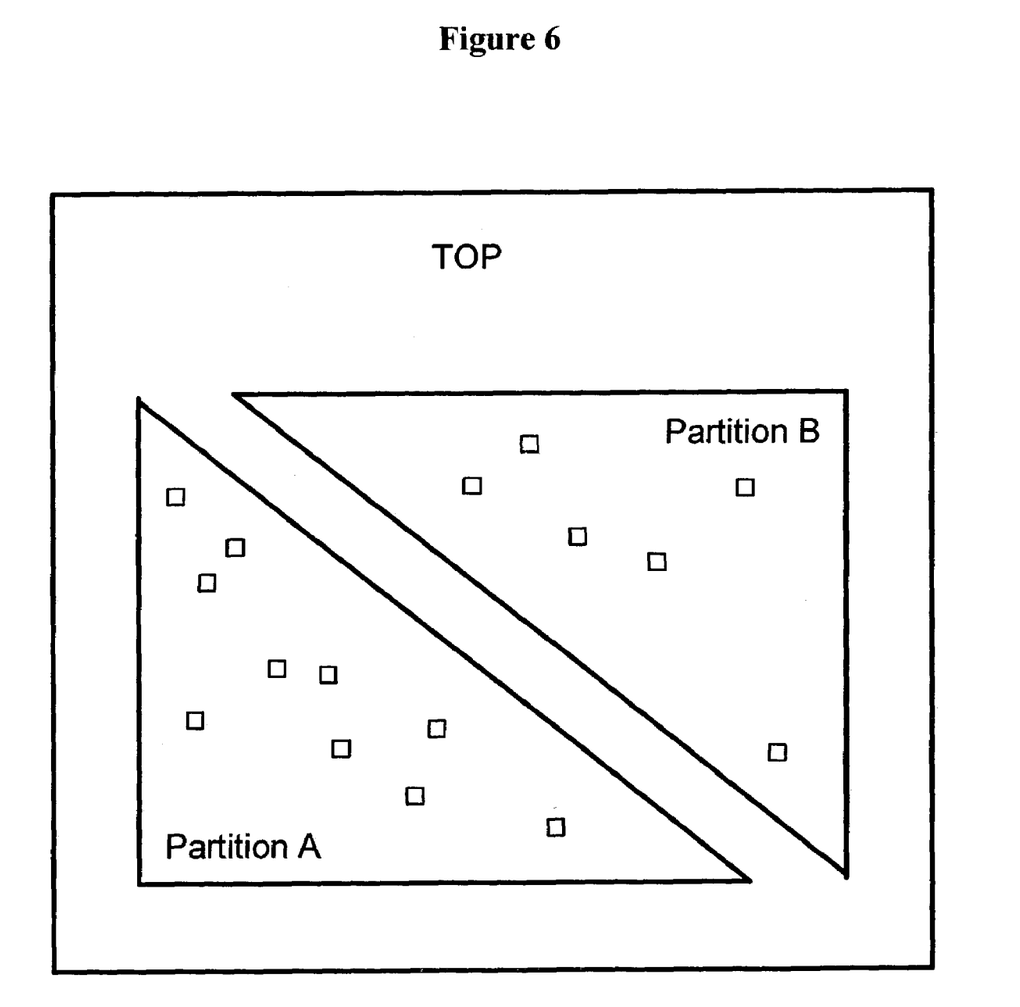

Considering the following example described by FIG. 6, there is provided a hierarchical design named TOP divided into two partitions. Partition A consists of ten circuits and a partition B consisting of six circuits. At this point, the sixteen circuits in the design TOP are placed arbitrarily. Considering now the bin structure shown in FIG. 7, the physical placement of the circuits is abstracted into the bin structure. All the circuits are either in bin 1 or bin 2. In the example shown, there are ten circuits in bin 1 (i.e., 2 from A and 8 from B) and six circuits in bin 2 (i.e., 4 from A and 2 from B). The size of the bin is 10. Thus, bin 1 has 0 units of available space and bin 2 has 4 units of available space.

Figure 7:
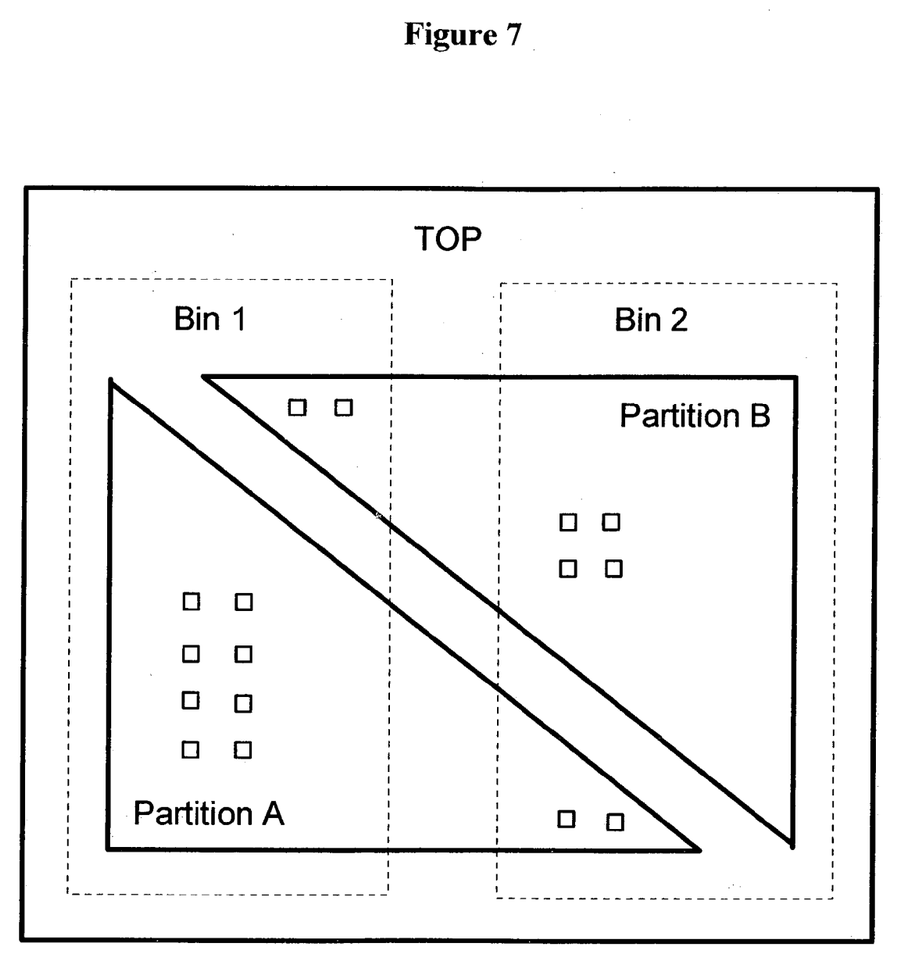

Assuming that the design shown in FIG. 7 is submitted to a distributed optimization system. Partitions A and B are optimized by two different processes. However, a resource map describing the bin structure is provided to both. If the process operating on partition A elects to insert a new circuit, it must necessarily assign this circuit to one of the two bins.

Even though partition A has only two circuits in bin 1, the resource map for the bin structure shows that there is no available space in bin 1. Thus, the new circuit is assigned to bin 2. A notification is sent to the server responsible for tracking the bin resource map stating that the resource (available space) in bin 2 has been reduced by 1. In turn, the server notifies the process optimizing partition B that the available space in bin 2 has, likewise, also been reduced.

Timing Abstraction

The server may maintain a copy of the an entire timing graph for the chip, or only a summary of the timing constraints at each partition boundary, detailing the available timing resource available to the partitions on either side of that boundary. It is desirable to have the clients own the subgraphs that correspond to their partition, while only maintaining the hierarchical boundary crossings at the server. Timing information at the boundaries can be separated into two major categories: right-moving and left-moving.

1. Right-moving data includes signal arrival time, rising and falling transition time, capacitive limits, and the like. In general, it refers to data that is projected forwards through the circuits.
2. Left-moving data includes signal required arrival time, capacitive load, and the like. In general, it refers to data that is projected backwards through the circuits.

Update Mechanism for Timing Abstraction

The timing resource map is merely a database with entries for each hierarchical boundary point. Each entry is divided into left data and right data. The left and right data clusters have each their own client that is responsible for keeping the information up to date. These clients represent both sides of the hierarchical boundary. By way of example, the client on the right side of a hierarchical boundary sends a notification request to the left data cluster. Correspondingly, when the left data cluster is modified, the client on the right side of the boundary is informed. It is important that each client keep track of the most recent update sent to the server for each hierarchical boundary point. Thus, the client has the option of sending only updates to the server when the boundary point changes, or when it changes more than a certain percentage.

Whereas the present invention has been described in terms of a physical area and timing resource abstraction, with optimizations applied to achieve timing closure, practitioners in the art will readily realize that other resources, such as routing resource, power supply current, power/thermal budget, substrate noise budget, etc., could be similarly abstracted and shared. Thus, other design objectives, such as signal integrity, power minimization, etc. could also be optimized via the distributed method of the present invention. Furthermore, it will be also understood by those skilled in the art that other changes and modifications to the algorithm may be introduced without departing from the spirit of the invention, all of which fall within the scope of the appended claims

The invention claimed is:

1. A method for performing timing closure on a very large scale integrated (VLSI) chip in a distributed environment comprising the steps of:
   providing a data model descriptive of the VLSI chip;
   subdividing said data model into partitions stored in a database and comprising each a plurality of interconnected circuits;
   distributing a set of physical and timing resources among each of said partitions to construct, place and route each of said partitions; and
   optimizing said partitions respectively stored in local copies of said database by having each partition directly communicate to the remaining partitions information related to latest updates on said set of physical and timing resources that relate to said VLSI chip, and directly receiving from the other optimized partitions information related to changes in said set of physical and timing resources related to said optimized partitions, said optimization continuing until a predetermined objective is reached.

2. The method as recited in claim 1, wherein said partitions are non-overlapping.

3. The method as recited in claim 1, wherein the optimization of said partitions is conducted concurrently.

4. The method as recited in claim 1, wherein said optimization comprises changes in physical location of circuits in said partitions.

5. The method as recited in claim 1, wherein said optimization comprises changes in routing of connections between the circuits in said partitions.

6. The method as recited in claim 1, wherein said optimization comprises changes in connectivity of the circuits in said partitions.

7. The method as recited in claim 1, wherein said physical and timing resources are allocated in a disjoint manner to allow each of said partitions to be optimized independently.

8. A method for performing timing closure on a very large scale integrated (VLSI) chip in a distributed environment comprising of steps of:
   providing a hierarchical design of the VLSI chip;
   partitioning said hierarchical design into a plurality of partitions;
   performing an initial distribution of physical and timing resources among said partitions comprising each a plurality of interconnected circuits;
   processing each of said partitions in parallel using the initial distribution physical and timing resources;
   generating for the partitioned hierarchical design abstractions of global utilization of physical and timing resources; and
   optimizing said partitions concurrently using the abstractions of global utilization of said physical and timing resources until a predetermined design objective is achieved.

9. The method as recited in claim 8, wherein each of the optimized partitions makes asynchronous changes to the abstractions of the global utilizations of physical and timing resources.

10. The method as recited in claim 9, wherein said asynchronous changes include decisions made during said optimization.

11. The method as recited in claim 8, wherein abstracting the physical resources comprises subdividing the chip area into separate bins with sufficient area required to place all the circuits currently assigned to said bin, thereby reducing the physical description of the chip from a plurality of circuits having fixed locations to a plurality of bins with available space therein.

12. The method as recited in claim 8, wherein abstracting timing resources further comprises reducing a timing graph of the partitioned hierarchical design to a database of hierarchical boundary points.

13. The method as recited in claim 12, wherein for each boundary point, information consisting of signal arrival times, signal transition times, capacitive load, load capacitive limits, and signal transition time limits.

14. The method as recited in claim 8, wherein said optimization performed on a partition further comprises communicating to others of said partitions any changes which have occurred to local resource abstractions to track consumption and release of said physical and timing resources.

15. The method as recited in claim 14, wherein the redistribution of physical resources during optimization is performed without constraining the physical location of the circuits in a partition to a particular sub-region of the chip.

16. A program storage device readable by a machine, tangibly embodying a program of instructions executable by the machine to perform method steps for performing timing closure on a very large scale integrated (VLSI) chip in a distributed environment, comprising the steps of:

provide a data model descriptive of the VLSI chip;

subdividing said data model of said VLSI chip into partitions stored in a database and comprising each a plurality of interconnected circuits;

distributing a set of physical and timing resources among each of said partitions to construct, place and route each of said partitions; and optimizing said partitions respectively stored in local copies of said database by having each partition directly communicate to the remaining partitions information related to latest updates on said set of physical and timing resources that relate to said VLSI chip, and directly receiving from the other optimized partitions information related to changes in said set of physical and timing resources related to said optimized partitions, said optimization continuing until a predetermined objective is reached.

17. A program storage device readable by a machine, tangibly embodying a program of instructions executable by the machine to perform method steps for performing timing closure on a very large scale integrated (VLSI) chip in a distributed environment, comprising the steps of:

providing a hierarchical design of the VLSI chip;

partitioning said hierarchical design into a plurality of partitions comprising each a plurality of interconnected circuits;

performing an initial distribution of physical and timing resources among said partitions;

processing each of said partitions in parallel using the initial distribution physical and timing resources;

generating for the partitioned hierarchical design abstractions of global utilization of physical and timing resources; and optimizing said partitions concurrently using the abstractions of global utilization of said physical and timing resources until a predetermined design objective is achieved.

* * * * *